(12) United States Patent
Kao et al.

(10) Patent No.: US 12,388,447 B2
(45) Date of Patent: Aug. 12, 2025

(54) CLOCK AND DATA RECOVERY CIRCUIT WITH SPREAD SPECTRUM CLOCKING SYNTHESIZER

(71) Applicant: MEDIATEK INC., Hsin-Chu (TW)

(72) Inventors: Chien-Kai Kao, Hsinchu (TW); Yi-Hsien Cho, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 18/648,493

(22) Filed: Apr. 29, 2024

(65) Prior Publication Data

US 2024/0283458 A1    Aug. 22, 2024

Related U.S. Application Data

(62) Division of application No. 17/902,917, filed on Sep. 5, 2022, now Pat. No. 12,003,245.

(Continued)

(51) Int. Cl.
*H03L 7/08* (2006.01)
*H04L 7/00* (2006.01)

(52) U.S. Cl.
CPC .......... *H03L 7/0807* (2013.01); *H04L 7/0025* (2013.01); *H04B 2201/7073* (2013.01)

(58) Field of Classification Search
CPC ........ H04B 1/69; H04B 1/707; H04B 1/7073; H04B 1/7085; H04B 1/7156; H04B 2201/7073; H03L 7/0807; H03L 7/081; H03L 7/085; H04L 7/0025; H04L 7/0331; H04L 27/2275
USPC ....... 375/130, 134, 135, 141, 145, 146, 326, 375/327, 375, 376; 327/147, 156, 159; 370/350, 516
See application file for complete search history.

(56) References Cited

U.S. PATENT DOCUMENTS

2010/0027586 A1    2/2010  Ogasawara
2013/0182747 A1    7/2013  Nakamura
(Continued)

FOREIGN PATENT DOCUMENTS

CN    102403999 A    4/2012
TW      1635710 B    9/2018

OTHER PUBLICATIONS

Hui Pan ,"A Digital Wideband CDR with ±15.6kppm Frequency Tracking at 8Gb/s in 40nm CMOS", 2011 IEEE International Solid-State Circuits Conference ,2011.

*Primary Examiner* — Young T. Tse
(74) *Attorney, Agent, or Firm* — Winston Hsu

(57) ABSTRACT

The present invention provides a circuitry including a PLL and a CDR circuit, wherein the CDR includes a phase detector, a digital loop filter, a first phase interpolator and a second phase interpolator. The PLL is configured to generate a first clock signal with SSC modulation and a control signal. The phase detector is configured to generate a detection result according an input signal and an output clock signal, wherein the input signal is with SSC modulation. The digital loop filter is configured to filter the detection result to generate a filtered signal. The first phase interpolator is configured to generate a second clock signal according to the filtered signal and the first clock signal. The second phase interpolator is configured to cancel an SSC component contributed by the first clock signal in the second clock signal to generate the output clock signal according to the control signal.

5 Claims, 4 Drawing Sheets

Related U.S. Application Data

(60) Provisional application No. 63/300,643, filed on Jan. 19, 2022, provisional application No. 63/282,205, filed on Nov. 23, 2021.

(56) References Cited

U.S. PATENT DOCUMENTS

| | | | |
|---|---|---|---|
| 2013/0329843 A1* | 12/2013 | Takeuchi | H03L 7/085 |
| | | | 375/375 |
| 2014/0029646 A1 | 1/2014 | Foxcroft | |
| 2015/0263851 A1 | 9/2015 | Takeuchi | |
| 2016/0013929 A1* | 1/2016 | Takanashi | H04L 7/0004 |
| | | | 375/376 |
| 2016/0049947 A1 | 2/2016 | Adachi | |
| 2016/0373115 A1* | 12/2016 | Lee | H03K 5/135 |
| 2022/0029629 A1* | 1/2022 | Yang | H03L 7/089 |
| 2022/0209930 A1 | 6/2022 | Kim | |

\* cited by examiner

CLOCK AND DATA RECOVERY CIRCUIT WITH SPREAD SPECTRUM CLOCKING SYNTHESIZER

CROSS REFERENCE TO RELATED APPLICATION

This application is a division of U.S. application Ser. No. 17/902,917, now U.S. Pat. No. 12,003,245, filed on Sep. 5, 2022, which claims the benefit of U.S. Provisional Application No. 63/282,205, filed on Nov. 23, 2021, and claims the benefit of U.S. Provisional Application No. 63/300,643, filed on Jan. 19, 2022. The contents of these applications are incorporated herein by reference.

BACKGROUND

In a digital-based clock and data recovery (CDR) circuit of a serializer/deserializer (SerDes) with spread spectrum clocking (SSC), the CDR circuit receives an input signal from a previous stage and a reference clock signal to generate an output clock signal, wherein the reference clock signal generally comes from a phase-locked loop (PLL) of a transmitter of the SerDes. However, because the near-end SSC used in the reference clock signal is different from the far-end SSC used in the input signal, there will be a residual static phase error between the input signal and the output clock signal, lowering receiver performance.

SUMMARY

It is therefore an objective of the present invention to provide a CDR circuit with lower static phase error between the input signal and the output clock signal, to solve the above-mentioned problems.

According to one embodiment of the present invention, a circuitry comprising a PLL and a CDR circuit is disclosed, wherein the CDR circuit comprises a phase detector, a digital loop filter, a SSC demodulator, a control code generator and a phase interpolator. The PLL is configured to generate a first clock signal with SSC modulation and a SSC direction signal. The phase detector is configured to compare phases of an input signal and an output clock signal to generate a detection result, wherein the input signal is with SSC modulation. The digital loop filter is configured to filter the detection result to generate a filtered signal. The SSC demodulator is configured to receive the SSC direction signal to generate a control signal. The control code generator is configured to generate a control code according to the filtered signal and the control signal. The phase interpolator is configured to use the control code to adjust a phase of the first clock signal to generate the output clock signal.

According to one embodiment of the present invention, a circuitry comprising a PLL and a CDR circuit is disclosed, wherein the CDR circuit comprises a detection result, a digital loop filter, a first phase interpolator and a second phase interpolator. The PLL is configured to generate a first clock signal with SSC modulation and a control signal. The phase detector is configured to generate a detection result according an input signal and an output clock signal, wherein the input signal is with SSC modulation. The digital loop filter is coupled to the phase detector, and is configured to filter the detection result to generate a filtered signal. The first phase interpolator is configured to generate an output clock signal according to the filtered signal and the first clock signal. The second phase interpolator is configured to cancel the SSC of the first clock signal or cancel the SSC of the output clock signal according to the control signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
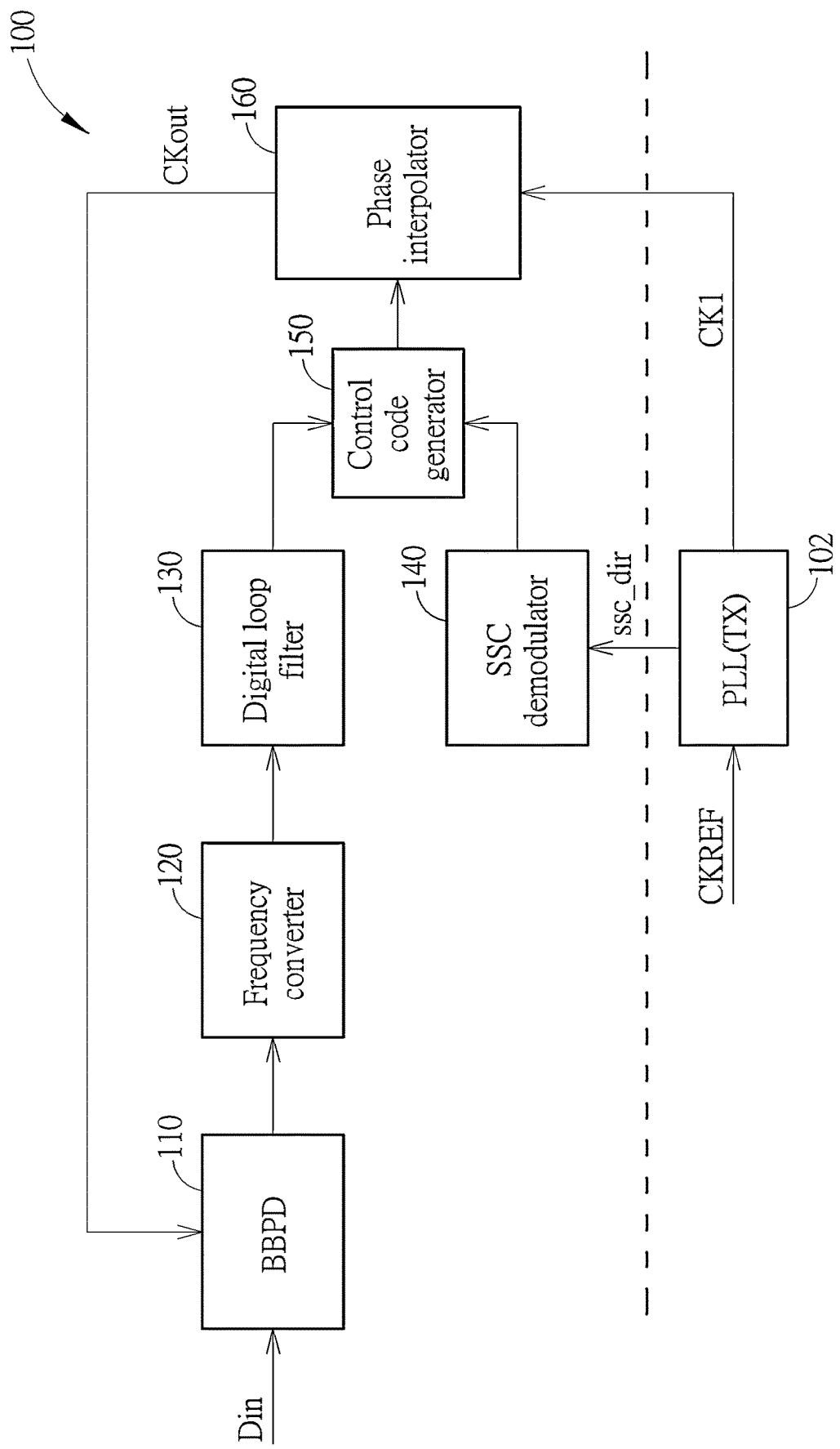
FIG. 1 is a diagram illustrating CDR circuit according to one embodiment of the present invention.

FIG. 1 is a diagram illustrating CDR circuit 100 according to one embodiment of the present invention. As shown in FIG. 1, the CDR circuit 100 is a phase interpolator-based (PI-based) CDR circuit comprising a phase detector (in this embodiment, a bang-bang phase detector (BBPD) 110), a frequency converter 120, a digital loop filter 130, a SSC demodulator 140, a control code generator 150 and a phase interpolator 160. In this embodiment, the CDR circuit 100 can be used in a SerDes with SSC for high speed communications.

In the operation of the CDR circuit 100, the BBPD 110 receives an input signal (digital input signal) Din from a previous stage, and compares phases of the input signal Din and an output clock signal CKout to generate a detection result, wherein the input signal Din is with SSC modulation, and the detection result may indicate phase information between the input signal Din and the output clock signal CKout (e.g., the phase of the input signal Din leads the phase of the output clock signal CKout, or the phase of the input signal Din lags behind the phase of the output clock signal CKout). The frequency converter 120 is an optional component, and the frequency converter 120 converts the detection result to another frequency. Then, the digital loop filter 130 filters the detection result to generate a filtered signal to the control code generator 150 to generate a control code. Then, the phase interpolator 160 uses the control code generated by the control code generator 150 to adjust a phase of a clock signal CK1 to generate the output clock signal CKout. In addition, each of the clock signal CK1 and the output clock signal CKout may be a single phase clock signal or clock signal with multiple phases.

It is noted that the operations of the BBPD 110, the frequency converter 120, the digital loop filter 130 and the phase interpolator 160 are known by a person skilled in the art, and the embodiment focuses on the SSC demodulator 140 and the control code generator 150, so the following description focuses on the SSC demodulator 140, and the details of other components are omitted here.

In this embodiment, the clock signal CK1 is generated by a PLL 102 of a transmitter using a reference clock signal CKREF, wherein the clock signal CK1 is with SSC modulation. Ideally, the SSC amplitude of the input signal Din is the same as the SSC amplitude of the clock signal CK1. However, because of the frequency drift and difference design methodology, the frequencies and SSC amplitudes of the input signal Din and the clock signal CK1 are not the same, and there will be a residual static phase error between the input signal Din and the output clock signal CKout. Specifically, assuming that the CDR circuit 100 uses a second-order loop to track SSC, the static phase error between the input signal Din and the output clock signal CKout can be shown as follows:

$$\Delta\phi = \lim_{s \to 0} s \frac{1}{1+G(s)}\left(\frac{A}{s^3}\right); \quad (1)$$

wherein "s" is a complex number frequency parameter of Laplace transform, G(s) is a loop gain, and "A" is a constant, which is related to SSC amplitude. In order to suppress the static phase error, the CDR circuit 100 includes the SSC demodulator 140 to reduce the value "A" in the above formula.

Figure 2:
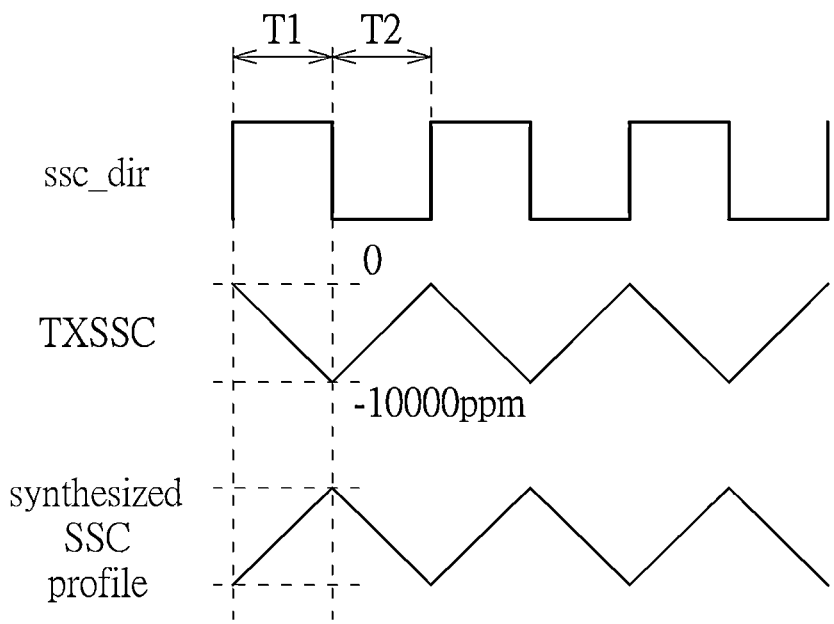
FIG. 2 shows timing diagram of the SSC direction signal, TXSSC and associated signal according to one embodiment of the present invention.

The SSC demodulator 140 receives a SSC direction signal ssc_dir from the PLL 102, wherein the SSC direction signal ssc_dir indicates the direction of the frequency changes. Taking FIG. 2 as an example, "TXSSC" shows the frequency of the clock signal CK1, wherein the frequency of the clock signal CK1 is changed between a specific frequency (e.g., 5 GHZ) and (1 ppm-10000 ppm)*specific frequency. It is noted that the SSC amplitude provided here is for illustrative, and in other embodiments, the SSC amplitude can be any other suitable value such as 5000 ppm. The SSC direction signal ssc_dir may be a square wave, wherein a high level indicates that the frequency of the clock signal CK1 is decreasing, and a low level indicates that the frequency of the clock signal CK1 is increasing. After receiving the SSC direction signal ssc_dir, a SSC synthesizer within the SSC demodulator 140 can generate a control signal Vc with information of SSC amplitude and frequency opposite to that of TXSSC. For example, in a first period T1, the frequency of the clock signal CK1 is changed from 5 GHz to (1 ppm-10000 ppm)*5 GHz, the SSC demodulator 140 can generate the control signal with the information indicating an opposite direction (e.g., the direction of frequency or phase); and in a second period T2, the frequency of the clock signal CK1 is changed from (1 ppm-10000 ppm)*5 GHz to 5 GHz, the SSC demodulator 140 can generate the control signal with the information indicating an opposite direction.

In one embodiment, the SSC demodulator 140 may analyze the SSC direction signal ssc_dir to generate frequency information of the clock signal CK1, and converts the frequency information to generate phase information of the clock signal CK1, wherein the phase information of the clock signal CK1 indicates the phase of the clock signal CK1 will move forward or backward. Then, the SSC demodulator 140 or the control code generator 150 can use this phase information to generate the control code.

The control code generator 150 receives the filtered signal from the digital loop filter 130 and the control signal from the SSC demodulator 140 to generate the control code to the phase interpolator 160, to adjust the phase of the clock signal CK1 to generate the output clock signal CKout. In this embodiment, because the control code comprises the information of the opposite frequency/phase direction of the clock signal CK1, the SSC component of the clock signal CK1 can be cancelled by the phase interpolator 160, and the influence of the clock signal CK1 on the output clock signal CKout is close to that of the clock signal without spread spectrum. For example, in the first period T1 shown in FIG. 2, the frequency of the clock signal CK1 is decreasing, so the SSC demodulator 140 can generate the control signal, and a component, contributed by the control signal, of the control code is used by the phase interpolator 160 to advance the phase of the clock signal CK1. Similarly, in the second period T2 shown in FIG. 2, the frequency of the clock signal CK1 is increasing, so the SSC demodulator 140 can generate the control signal, and the component, contributed by the control signal, of the control code is used by the phase interpolator 160 to delay the phase of the clock signal CK1.

Figure 3:
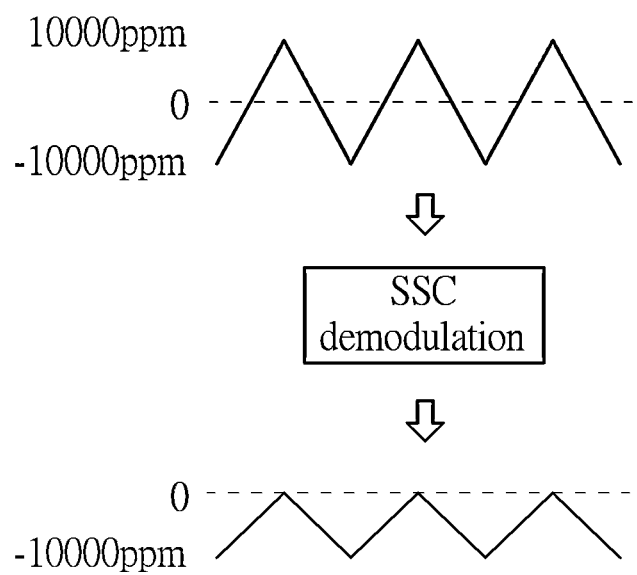
FIG. 3 shows that the static phase error is halved.

Referring to FIG. 3, by using the SSC demodulator 140 and the control code generator 150 to cancel the SSC component of the clock signal CK1 to generate the output clock signal CKout, the SSC amplitude is halved, and the value "A" in the above formula is also reduced so that the static phase error reduces 50%. In addition, by using the SSC demodulator 140, the frequency difference between the input signal Din and the output clock signal CKout is 10000 ppm or (−10000) ppm, and the SSC that the CDR circuit 100 needs to track is only the far-end SSC (i.e. the input signal Din).

Figure 4:
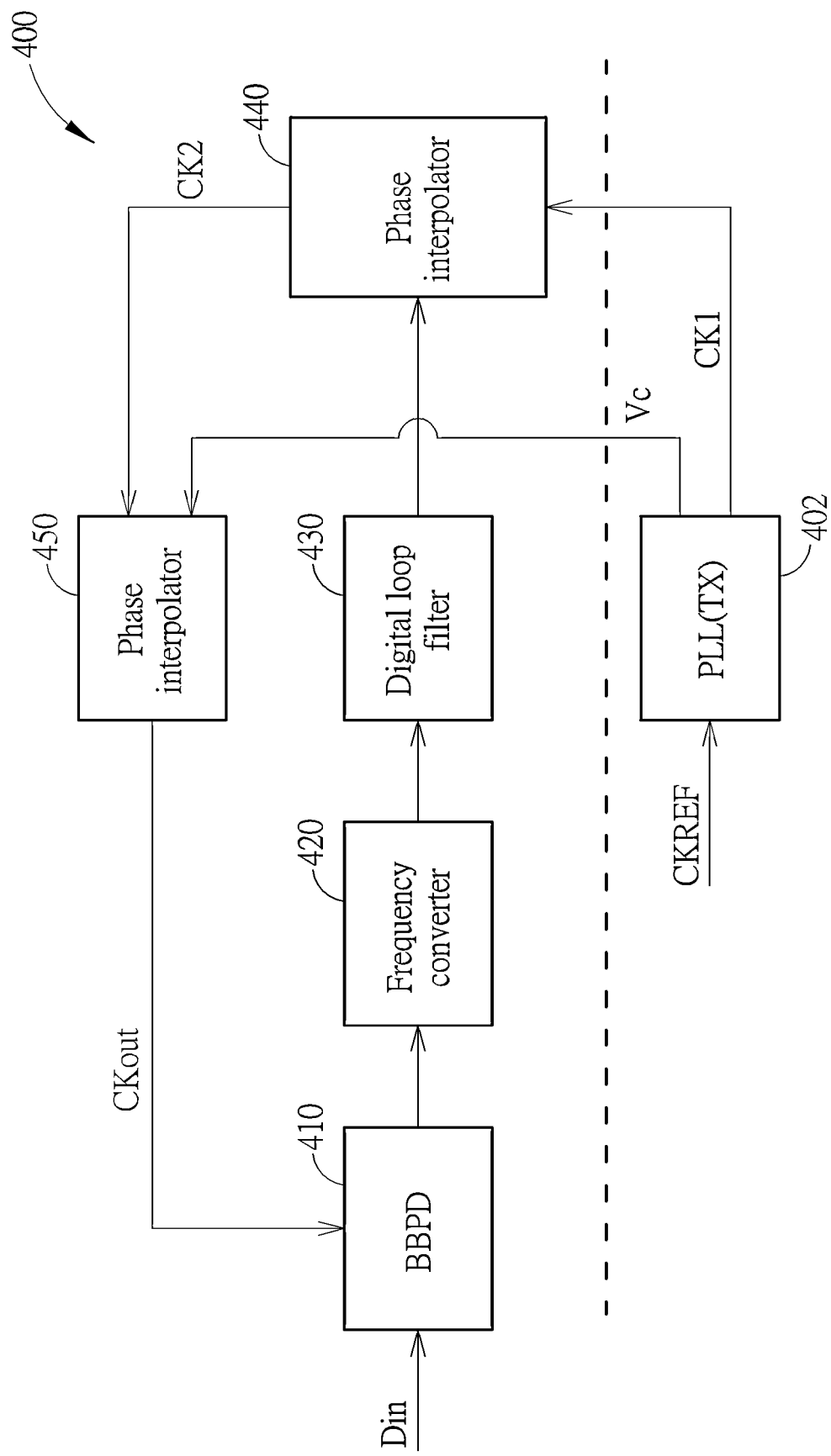
FIG. 4 is a diagram illustrating CDR circuit according to one embodiment of the present invention.

FIG. 4 is a diagram illustrating CDR circuit 400 according to one embodiment of the present invention. As shown in FIG. 4, the CDR circuit 400 is a PI-based CDR circuit comprising a phase detector (in this embodiment, a BBPD 410), a frequency converter 420, a digital loop filter 430, two phase interpolators 440 and 450. In this embodiment, the CDR circuit 400 can be used in a SerDes with SSC for high speed communications.

In the operation of the CDR circuit 400, the BBPD 410 receives an input signal (digital input signal) Din from a previous stage, and compares phases of the input signal Din and an output clock signal CKout to generate a detection result, wherein the input signal Din is with SSC modulation, and the detection result may indicate phase information between the input signal Din and the output clock signal CKout (e.g., the phase of the input signal Din leads the phase of the output clock signal CKout, or the phase of the input signal Din lags behind the phase of the output clock signal CKout). The frequency converter 420 is an optional component, and the frequency converter 420 converts the detection result to another frequency. Then, the digital loop filter 430 filters the detection result to generate a filtered signal. Then, the phase interpolator 440 uses the filtered signal to adjust a phase of a clock signal CK1 to generate a clock signal CK2, wherein the clock signal CK2 is used by the phase interpolator 450 to generate the output clock signal CKout. In addition, each of the clock signal CK1, the clock signal CK2 and the output clock signal CKout may be a single phase clock signal or clock signal with multiple phases.

It is noted that the operations of the BBPD 410, the frequency converter 420, the digital loop filter 430 and the phase interpolator 440 are known by a person skilled in the art, and the embodiment focuses on the phase interpolator 450, so the following description focuses on the phase interpolator 450, and the details of other components are omitted here.

In this embodiment, the clock signal CK1 is generated by a PLL 402 of a transmitter using a reference clock signal CKREF, wherein the clock signal CK1 is with SSC modulation. Ideally, the SSC amplitude of the input signal Din is the same as the SSC amplitude of the clock signal CK1. However, because of the frequency drift and difference design methodology, the frequencies and SSC amplitudes of the input signal Din and the clock signal CK1 are not the same, and there will be a residual static phase error between the input signal Din and the output clock signal CKout, wherein the static phase error can refer to the above formula (1).

In this embodiment, because the clock signal CK1 has SSC modulation, so the clock signal CK2 generated by the phase interpolator 440 also has the SSC modulation. In order to cancel the SSC of the clock signal CK2, the PLL 402 generates a control signal Vc to the phase interpolator 450 to adjust the phase of the clock signal CK2 to generate the output clock signal, wherein the control signal Vc comprises information of an opposite direction of the frequency/phase changes of the clock signal CK1. For example, in the first period T1 shown in FIG. 2, the frequency of the clock signal CK1 is decreasing, so the PLL 402 can generate the control signal Vc to control the phase interpolator 450 to advance the phase of the clock signal CK2. Similarly, in the second period T2 shown in FIG. 2, the frequency of the clock signal CK1 is increasing, so the PLL 402 can generate the control signal Vc to control the phase interpolator 450 to delay the phase of the clock signal CK2.

In light of above, by using the interpolator 450 to cancel the SSC component contributed by the first clock signal CK1 in the clock signal CK2 to generate the output clock signal CKout, the influence of the clock signal CK1 on the output clock signal CKout is close to that of the clock signal without spread spectrum, the SSC amplitude is halved, and the value "A" in the above formula (1) is also reduced so that the static phase error reduces 50%. In addition, by using the interpolator 450, the SSC that the CDR circuit 400 needs to track is only the far-end SSC (i.e. the input signal Din).

Figure 5:
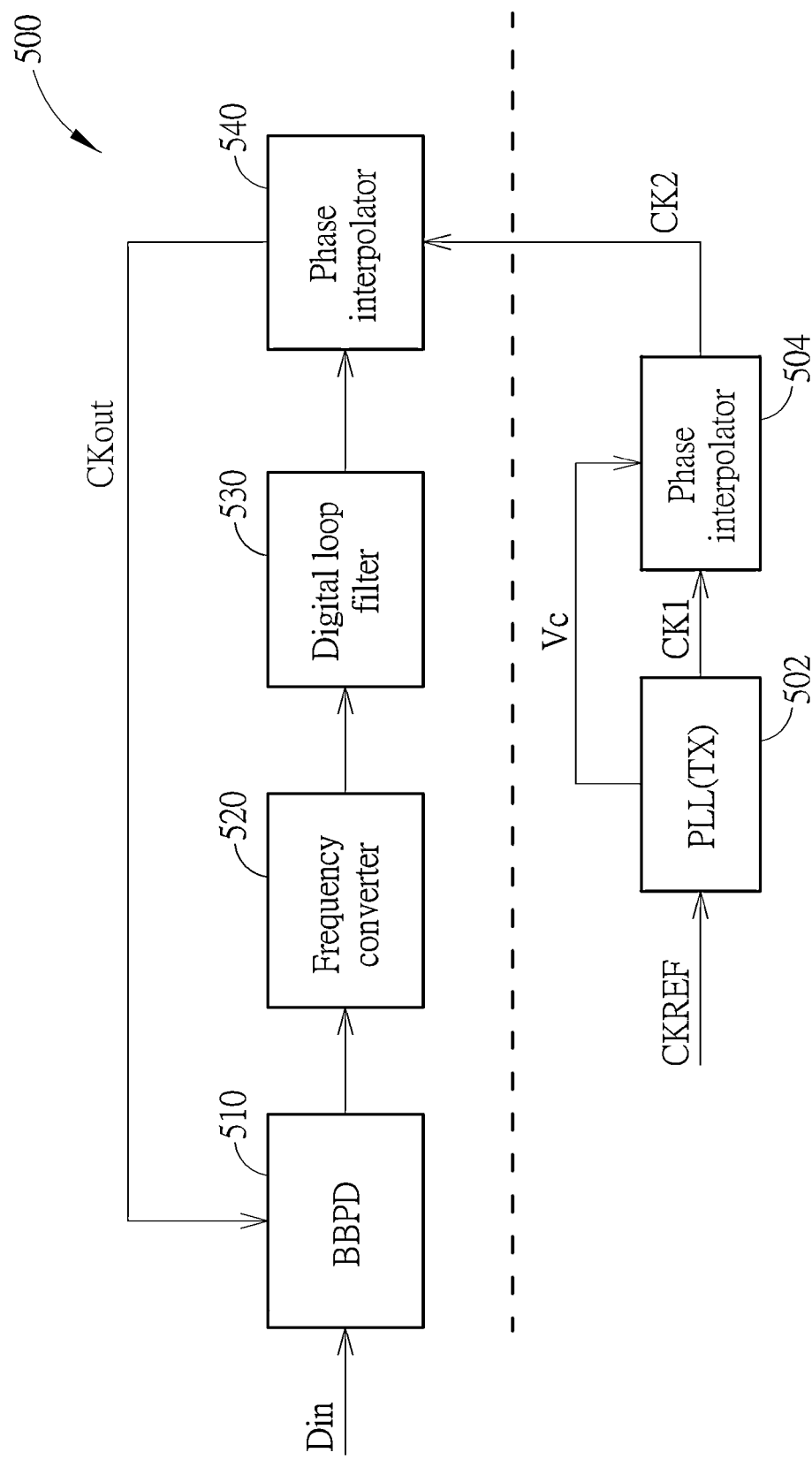
FIG. 5 is a diagram illustrating CDR circuit according to one embodiment of the present invention.

FIG. 5 is a diagram illustrating CDR circuit 500 according to one embodiment of the present invention. As shown in FIG. 5, the CDR circuit 500 is a PI-based CDR circuit comprising a phase detector (in this embodiment, a BBPD 510), a frequency converter 520, a digital loop filter 530 and a phase interpolator 540. In this embodiment, the CDR circuit 500 can be used in a SerDes with SSC for high speed communications.

In the operation of the CDR circuit 500, the BBPD 510 receives an input signal (digital input signal) Din from a previous stage, and compares phases of the input signal Din and an output clock signal CKout to generate a detection result, wherein the input signal Din is with SSC modulation, and the detection result may indicate phase information between the input signal Din and the output clock signal CKout (e.g., the phase of the input signal Din leads the phase of the output clock signal CKout, or the phase of the input signal Din lags behind the phase of the output clock signal CKout). The frequency converter 520 is an optional component, and the frequency converter 520 converts the detection result to another frequency. Then, the digital loop filter 530 filters the detection result to generate a filtered signal. Then, the phase interpolator 540 uses the filtered signal to adjust a phase of a clock signal CK2 to generate the output clock signal CKout. In addition, each of the clock signal CK1, the clock signal CK2 and the output clock signal CKout may be a single phase clock signal or clock signal with multiple phases.

It is noted that the operations of the BBPD 510, the frequency converter 520, the digital loop filter 530 and the phase interpolator 540 are known by a person skilled in the art, and the embodiment focuses on the generation of the clock signal CK2, so the following description focuses on a phase interpolator 504, and the details of other components are omitted here.

In this embodiment, a clock signal CK1 is generated by a PLL 502 of a transmitter using a reference clock signal CKREF, wherein the clock signal CK1 is with SSC modulation. Ideally, the SSC amplitude of the input signal Din is the same as the SSC amplitude of the clock signal CK1. However, because of the frequency drift and difference design methodology, the frequencies and SSC amplitudes of the input signal Din and the clock signal CK1 are not the same, and there will be a residual static phase error between the input signal Din and the output clock signal CKout, wherein the static phase error can refer to the above formula (1).

In this embodiment, in order to cancel the SSC of the clock signal CK1, the PLL 502 generates a control signal Vc to the phase interpolator 504 to adjust the phase of the clock signal CK1 to generate the clock signal CK2, wherein the control signal Vc comprises information of an opposite direction of the frequency/phase changes of the clock signal CK1. For example, in the first period T1 shown in FIG. 2, the frequency of the clock signal CK1 is decreasing, so the PLL 502 can generate the control signal Vc to control the phase interpolator 504 to advance the phase of the clock signal CK1. Similarly, in the second period T2 shown in FIG. 2, the frequency of the clock signal CK1 is increasing, so the PLL 502 can generate the control signal Vc to control the phase interpolator 504 to delay the phase of the clock signal CK1.

In light of above, by using the interpolator 504 to cancel the SSC of the clock signal CK1 to generate the clock signal CK2 that is close to a clock signal without spread spectrum, the SSC amplitude is halved, and the value "A" in the above formula (1) is also reduced so that the static phase error reduces 50%. In addition, by using the interpolator 504, the SSC that the CDR circuit 500 needs to track is only the far-end SSC (i.e. the input signal Din).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuitry, comprising:
   a phase-locked loop, configured to generate a first clock signal with spread-spectrum clocking (SSC) modulation and a control signal; and
   a clock and data recovery (CDR) circuit, comprising:
   a phase detector, configured to generate a detection result according an input signal and an output clock signal, wherein the input signal is with SSC modulation;

a digital loop filter, coupled to the phase detector, configured to filter the detection result to generate a filtered signal;

a first phase interpolator, configured to generate a second clock signal according to the filtered signal and the first clock signal; and a second phase interpolator, configured to cancel an SSC component contributed by the first clock signal in the second clock signal to generate the output clock signal according to the control signal.

2. The circuitry of claim 1, wherein the second phase interpolator is positioned between the phase detector and the first phase interpolator, the second phase interpolator is configured to adjust a phase of the output clock signal to generate an adjusted output clock signal, and the phase detector is configured to compare the phases of the input signal and the adjusted output clock signal to generate the detection result.

3. The circuitry of claim 2, wherein the control signal comprises information of an opposite direction of a frequency change of the first clock signal.

4. A circuitry, comprising:

a phase-locked loop, configured to generate a first clock signal with spread-spectrum clocking (SSC) modulation and a control signal;

a clock and data recovery (CDR) circuit, comprising:

a phase detector, configured to generate a detection result according an input signal and an output clock signal, wherein the input signal is with SSC modulation;

a digital loop filter, coupled to the phase detector, configured to filter the detection result to generate a filtered signal; and a first phase interpolator, configured to generate the output clock signal according to the filtered signal and a second clock signal; and a second phase interpolator, configured to cancel an SSC component contributed by the first clock signal to generate the second clock signal according to the control signal, wherein the second phase interpolator is positioned between the PLL and the first phase interpolator, and the second phase interpolator is configured to adjust a phase of the first clock signal to generate the second clock signal, and the first phase interpolator is configured to adjust a phase of the second clock signal to generate the output clock signal according to the filtered signal.

5. The circuitry of claim 4, wherein the control signal comprises information of an opposite direction of a frequency change of the first clock signal.

* * * * *